HEAT EXCHANGE TECHNIQUES FOR ELECTRONIC POWER SUPPLIES

Filed March 20, 1967

2 Sheets-Sheet 1

INVENTORS
LESTER DUBIN
BENJAMIN SHMURAK

BY

Morgan, Finnegan, Durham & Pine
ATTORNEYS

HEAT EXCHANGE TECHNIQUES FOR ELECTRONIC POWER SUPPLIES

Filed March 20, 1967 2 Sheets-Sheet 2

INVENTORS
LESTER DUBIN
BENJAMIN SHMURAK
BY
Morgan, Finnegan, Durham & Pine
ATTORNEYS United States Patent Office 3,401,744

Patented Sept. 17, 1968

3,401,744

HEAT EXCHANGE TECHNIQUES FOR ELECTRONIC POWER SUPPLIES

Lester Dubin, Pelham Manor, and Benjamin Shmurak, Lynbrook, N.Y., assignors to Lambda Electronics Corporation, Melville, N.Y., a corporation of New York Filed Mar. 20, 1967, Ser. No. 624,360
11 Claims. (Cl. 165—80)

ABSTRACT OF THE DISCLOSURE

This invention relates generally to heat exchange techniques for use in designing electronic power supplies and more particularly, to techniques for minimizing the difference in operating temperatures of the hottest and coolest power transistors of a power supply in order to effect a reduction in the number of power transistors required for providing a given power output without the danger of exceeding maximum permissible transistor junction operating temperatures. The power transistors are mounted along the base plate of a heat dissipating unit having a plurality of heat radiating fins, the transistors and fins being arranged and thermally coupled to allocate greater fin radiating area to the more centrally located transistors for dissipating heat therefrom than to the outermore transistors on the base plate. In the illustrative embodiment, the transistors are mounted in parallel rows on a base plate having plate-like fins depending therefrom to extend parallel to the transistor rows, each of the transistors being directly thermally coupled to a like number of fins with supplemental fins depending from the base plate intermediate the centrally located transistor rows. The spacing between transistors and between fins is adjusted to provide an optimum sharing of the heat dissipating load.

*Background and summary of the invention*

The power transistors of electronic power supplies are temperature sensitive devices, each transistor having a maximum permissible junction operating temperature, so called because operation beyond such temperature subjects the device to the danger of physical breakdown. In addition to this characteristic, power transistors generate heat during operation, the quantity of heat generated bearing a direct relationship to the amount of current that a particular transistor is carrying at a given time. It is imperative, therefore, that sufficient heat be dissipated from the power transistors during operation to insure against any of them exceeding their maximum temperature ratings.

In designing an electronic power supply, the number of power transistors required is determined on the basis of their operating temperatures under maximum load conditions. Generally speaking, the larger the unit employed for dissipating heat from the transistors required for a given power output. However, the desirability of reducing the number of power transistors must be weighed against the desirability of compactness and the increasing emphasis being placed upon miniaturization. Moreover, as a practical matter, the temperature of the hottest transistor is the critical factor in determining the number of transistors required so that where a large imbalance in the load distribution between transistors is present, merely increasing the size of the heat dissipator might prove of no avail.

The conventional heat dissipating unit has a plurality of plate-like heat radiating fins depending in parallel relation from a base plate, the transistors usually being mounted on the base plate for direct heat exchange therebetween. In the past, the fins and transistors have been uniformly spaced along the base plate and thermally coupled so that the same amount of fin radiating area is allocated to dissipate heat from each transistor.

In accordance with the instant invention, the arrangement of transistors and fins and the thermal coupling therebetween is controlled so that different amounts of fin radiating area are allocated for dissipating heat from the different transistors in accordance with their positions on the base plate, the more centrally located transistors being provided with greater fin radiating area. The proper arrangement of fins to transistors can be achieved by varying the spacing of the transistors and/or the fins. In an illustrative embodiment equal numbers of fine are positioned directly opposite from the different transistors and are directly thermally coupled thereto. In addition, supplementary fins are positioned to depend from the base plate intermediate the centrally located transistors. The transistors themselves are spaced apart so that the spacing beween fins gradually decreases as the center of the base plate is approached in order to provide optimum temperature gradient along the base plate.

With such a fin allocation, a reduction in the number of transistors required for operation under maximum load conditions is obtained without having to increase the size or number of heat radiating fins. For example, in an electronic power supply normally requiring twenty power transistors, it has been found that two transistors can be eliminated while still providing the same output characteristics with substantially the same heat dissipating unit merely by allocating the fins in accordance with the instant invention. In fact, it has been found that even though less trasistors are employed, the operating characteristics of the supply are improved because such an arrangement provides for better current balancing between transistors, i.e., a more equal sharing of the current load is obtained.

*Brief description of drawings*

Having summarized the invention, a more detailed description follows in which reference is made to the accompanying drawings incorporated herein for the purpose of illustrating a typical embodiment of the invention, wherein.

*Detailed description of illustrative embodiment*

Figure 1:
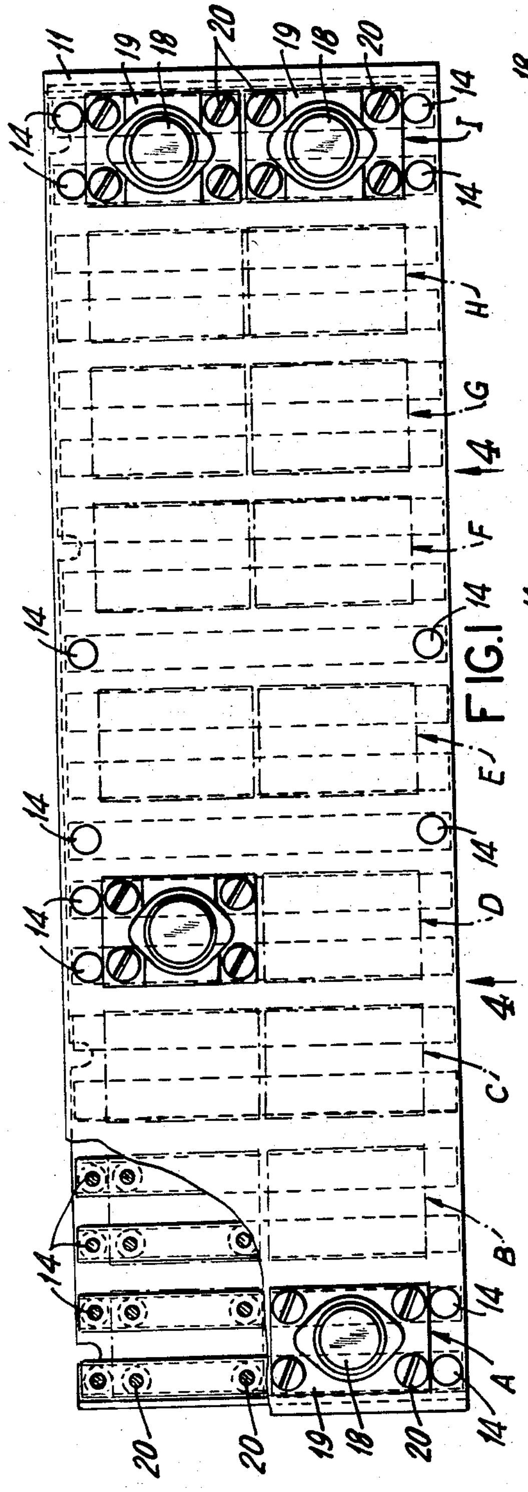
FIGURE 1 is a top plan view of a heat dissipating unit having a fin allocation in accordance with the invention.
Figure 2:
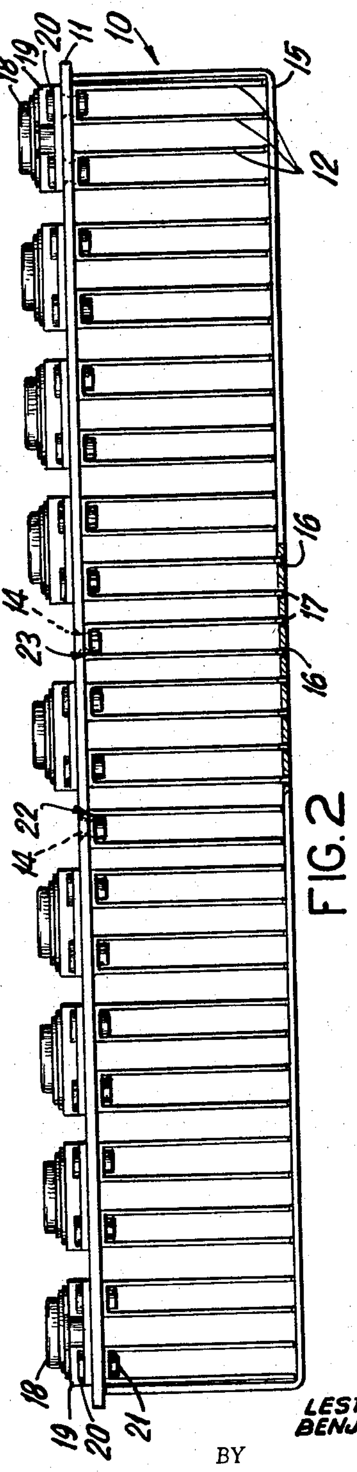
FIGURE 2 is an elevational view of the unit of FIGURE 1.

Turning now in detail to the drawings wherein like reference characters are employed to designate like parts throughout and referring specifically to FIGURES 1 and 2, a heat dissipating unit 10 including a rectangular base plate 11 and a plurality of parallel heat radiating fins 12 depending therefrom in heat conductive relation is shown. Fins 12, which are rectangular in configuration, are illustratively pre-formed in identical pairs, the fins of each pair being spaced apart and integrally joined by a bridge section 13. In the assembled unit, bridge sections 13 engage base plate 11 on one side thereof, being joined thereto by any suitable means such as by rivets 14 and/or by welding, and are disposed to extend transversely of the long dimension of base plate 11 so that fins 12 depend in parallel relation lengthwise of the base plate. A cover plate 15 formed with a plurality of positioning apertures 16 for receiving extensions 17 from the free ends of each fin is provided for imparting additional structural rigidity to the unit.

A plurality of power transistors 18, illustratively eighteen in number, are mounted on base plate 11. Transistors 18 are arranged in two identical parallel lines to form nine rows A–I of two transistors each extending parallel to bridge sections 13. Transistors 18 are mounted on individual heat conductive mounting blocks 19 which engage base plate 11 for heat exchange therebetween and are secured thereto by bolts 20 and nuts 21 as described below.

In accordance with the invention, the transistors and fins are relatively arranged and thermally coupled so that greater fin radiating area is allocated to the more centrally located transistors in the linear arrays.

In the illustrative embodiment, each transistor is directly thermally coupled to four fins of the heat dissipating unit. This is accomplished by positioning the bridge sections 13 of two fin pairs directly opposite each transistor mounting block 19 so that bolts 20 pass through base plate 11 and the corresponding bridge sections. When nuts 21 are tightened, the mounting blocks 19, base plate 11 and corresponding bridge sections 13 are compressed together placing mounting blocks 19 in optimum heat conductive relation with their associated fins. In addition to the foregoing direct thermal coupling of fins to transistors, supplementary fin pairs 22 and 23 are positioned to depend from the base plate intermediate transistor rows D and E and rows E and F respectively.

Figure 4:
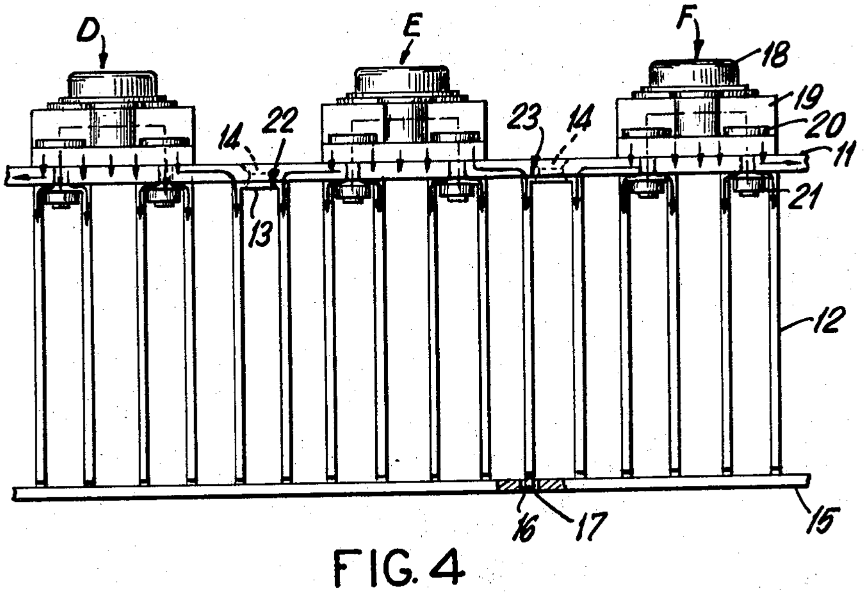
FIGURE 4 is an enlarged fragmentary elevational view taken on lines 4—4 of FIGURE 1.

Subject to the temperature gradient along base plate 11 at and adjacent to transistor rows D, E and F, it can be seen that such a heat exchange arrangement provides, in addition to the four fins directly coupled to each transistor, at least two supplemental heat radiating fins for dissipating heat from the transistors in row E and at least one supplemental fin for dissipating heat from the transistors in each of rows D and F. (See FIGURE 4.) The transistors in the remaining rows A–C and G–I each have four fins directly coupled thereto for heat dissipation, subject again to variations in the temperature gradient along the base plate. Wherever and whenever the temperature gradient dictates, fins from adjacent transistors will assist in the dissipation of heat from a particular transistor or transistors in any of the rows.

The optimum spacing between fins and transistors to promote this sharing of the heat dissipating load can be determined empirically. In the illustrative embodiment, the transistor rows are non-uniformly spaced apart along the base plate, the spacing between rows D and E and between rows E and F being substantially identical and substantially greater than the spacing between the rest of the rows. In addition, the spacing between rows A and B and between rows H and I are substantially equal and are somewhat greater than the spacing between rows B–C, C–D, F–G and G–H. Since the majority of the fins in the illustrative embodiment are keyed to the various transistors, this non-uniform transistor spacing also results in the non-uniform spacing of the fins to achieve the sharing arrangement desired.

It has been found that with a fin allocation in accordance with the instant invention a substantial reduction in the number of power transistors required to produce a given power output can be obtained with substantially the same size heat dissipating unit without the danger of the transistors exceeding their maximum permissible junction operating temperatures. For example, employment of the heat dissipating unit illustrated herein with the heat exchange arrangement and controlled thermal coupling shown and described permits a 10% reduction in the number of power transistors required. Thus, with a uniform heat exchange arrangement of power transistors and fins in accordance with the prior art, twenty transistors would be needed where a heat dissipating unit corresponding to the unit illustrated herein in size and number of fins is employed.

Figure 3:
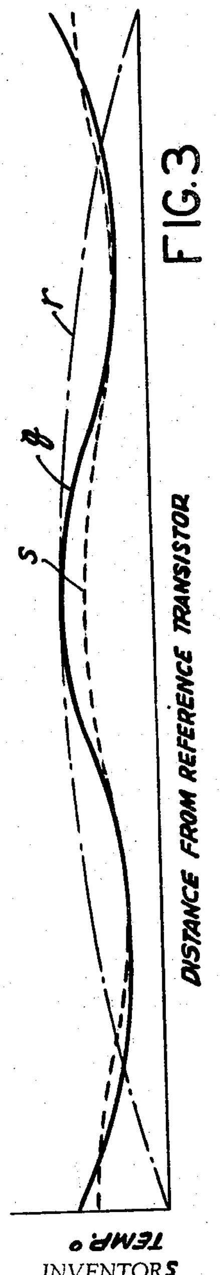
FIGURE 3 is a graphical illustration comparing the comparing the temperature distribution of the illustrated embodiment with that of the prior art and with that of an arrangement in accordance with the invention wherein the prior art number of transistors are included.

Serving to illustrate graphically the improved temperature distribution obtained with the invention are the curves shown in FIGURE 3.

Curve $q$ represents a plot of operating temperatures under a given current load of the transistors in each transistor line of the illustrative embodiment. Curve $r$ represents a plot of the temperatures of twenty transistors when operating under the same load in a prior art arrangement. Curve $s$ represents a temperature plot of the same twenty transistors when arranged and thermally coupled in accordance with the instant invention. It becomes immediately apparent that a substantial difference exists between the temperatures of the end transistors and those of the centrally located transistors in the prior art arrangement. Where the same number of transistors are arranged and thermally coupled in accordance with the invention, a greatly improved temperature distribution curve is produced with the temperatures of the hottest transistors being significantly lower than the temperature of the hottest transistor in the prior art arrangement. Where a 10% reduction in the number of transistors is made, as in the illustrative embodiment, the temperatures of the hottest transistors, which are located at the center and ends of the base plate, still do not exceed the temperatures of the hottest transistor in the prior art arrangement.

Figure 5:
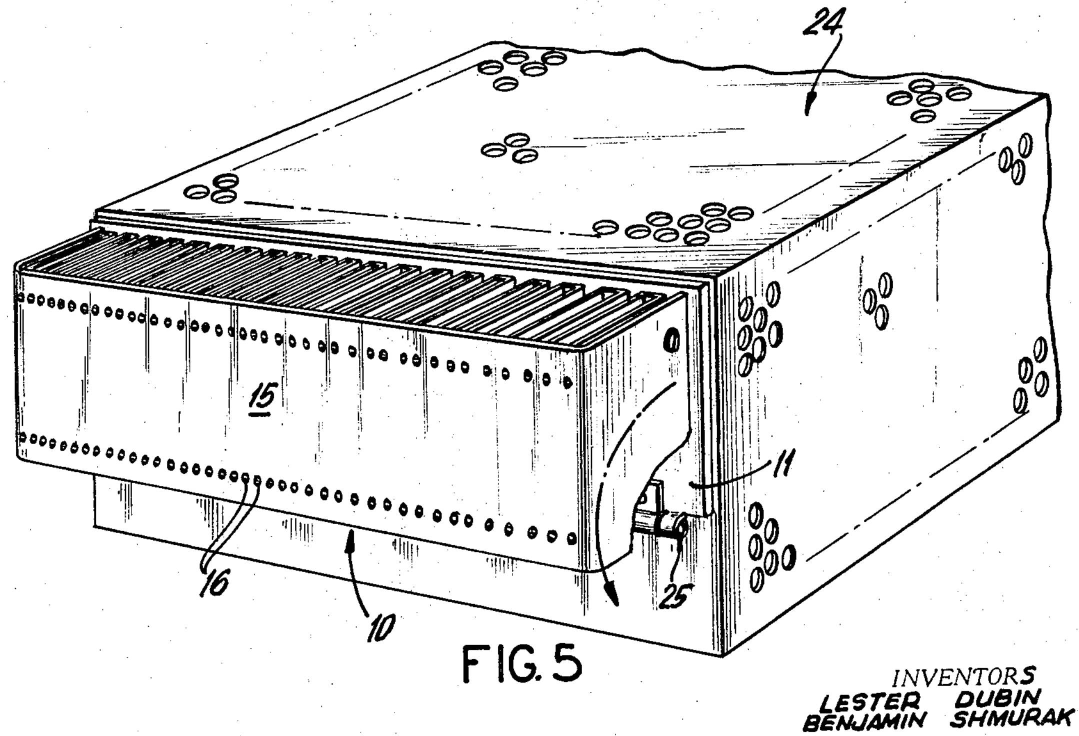
FIGURE 5 is a view in perspective illustrating a power supply module with the heat dissipating unit of FIGURE 1 mounted thereon.

The heat dissipating unit of FIGURES 1 and 2 is shown in FIGURE 5 mounted on a power supply module 24. Illustratively, the unit is mounted for rotation away from the power supply chassis by means of a hinge or hinges 25 to permit easy access to the transistors which are mounted on the enclosed side of base plate 11.

It is to be understood that the invention is not limited to the particular structures, elements and arrangements shown and described herein for the purpose of illustration, but departures may be made therefrom within the scope of the invention as defined in the appended claims without sacrificing its chief advantages.

What is claimed is:

1. In an electronic power supply including a heat dissipator of the type having a base plate and a plurality of heat radiating fins depending therefrom in heat conductive relation and a plurality of heat generating power transistors mounted on said base plate for heat exchange therebetween, the improvement comprising the nonuniform allocation of fin radiating area to the various transistors in accordance with their relative positions on said base plate to reduce the difference in operating temperatures between the hottest and coolest of said transistors.

2. An improvement in accordance with claim 1 wherein greater fin radiating area is allocated to the more centrally located transistors on said base plate.

3. An improvement in accordance with claim 2 wherein said fin allocation is obtained by placing greater numbers of fins in close proximity to the centrally located transistors on said base plate than to the outermore transistors.

4. An improvement in accordance with claim 2 wherein the spacing between the centrally located transistors on said base plate is greater than the spacing between the rest of said transistors, said fins being spaced so that some of said fins depend from said base plate intermediate said centrally located transistors.

5. An improvement in accordance with claim 2 wherein the spacing between fins decreases as the center of said base plate is approached.

6. In an electronic power supply including a heat dissipator of the type having a base plate and a plurality of plate-like heat radiating fins thermally coupled to and depending in parallel relation from said base plate and a plurality of heat generating power transistors mounted on said base plate for heat exchange therebetween in a line extending transversely of said fins, the improvement comprising the allocation of greater fin radiating area to the more centrally located transistors for dissipating heat therefrom than to the outermore transistors in said line.

7. An improvement in accordance with claim 6 wherein the spacing between fins gradually decreases as the center of said line of transistors is approached.

8. An improvement in accordance with claim 7 wherein the spacing between the transistors centrally located in said line is substantially greater than the spacing between the rest of said transistors.

9. An improvement in accordance with claim 7 wherein the same number of fins depend from said base plate opposite each transistor with supplementary fins depending from said base plate intermediate the centrally located transistors in said line.

10. An improvement in accordance with claim 9 wherein each of said transistors are directly thermally coupled to those fins positioned directly opposite therefrom.

11. An improvement in accordance with claim 6 wherein each transistor is directly thermally coupled to a like number of fins, the centrally located transistors in said line be provided with supplementary fins to assist in the heat dissipation therefrom.

No references cited.

ROBERT A. O'LEARY, *Primary Examiner.*

C. SUKALO, *Assistant Examiner.*